United States Patent
Hirata

(10) Patent No.: US 9,121,918 B2
(45) Date of Patent: Sep. 1, 2015

(54) IMAGE ACQUIRING METHOD AND IMAGE ACQUIRING APPARATUS

(75) Inventor: Hiroshi Hirata, Hokkaido (JP)

(73) Assignee: National University Corporation Hokkaido University, Hakkaido (JP)

( * ) Notice: Subject to any disclaimer, the term of this patent is extended or adjusted under 35 U.S.C. 154(b) by 387 days.

(21) Appl. No.: 13/812,203

(22) PCT Filed: Jul. 26, 2011

(86) PCT No.: PCT/JP2011/004201
§ 371 (c)(1),
(2), (4) Date: Jan. 25, 2013

(87) PCT Pub. No.: WO2012/014445
PCT Pub. Date: Feb. 2, 2012

(65) Prior Publication Data
US 2013/0119986 A1    May 16, 2013

(30) Foreign Application Priority Data

Jul. 26, 2010   (JP) ................. 2010-167238

(51) Int. Cl.
*G01R 33/60*   (2006.01)
*G06F 17/10*   (2006.01)

(52) U.S. Cl.
CPC ............ *G01R 33/60* (2013.01); *G06F 17/10* (2013.01)

(58) Field of Classification Search
CPC ........ G01R 33/60; G01R 33/24; G01R 33/62; G06F 17/10
USPC ................... 324/300–322; 436/173
See application file for complete search history.

(56) References Cited

FOREIGN PATENT DOCUMENTS

| JP | 3317862 A | 5/1998 |
|----|-----------|--------|
| JP | 2000-166891 A | 6/2000 |
| JP | 2006-204551 A | 8/2006 |

OTHER PUBLICATIONS

Sato-Akaba, Hideo, Hirotada Fujii, and Hiroshi Hirata. "Development and testing of a CW-EPR apparatus for imaging of short-lifetime nitroxyl radicals in mouse head." Journal of Magnetic Resonance 193.2 (2008): 191-198.*

H. Utsumi et al., "Simultaneous Molecular Imaging of Redox Reactions Monitored by Overhauser-Enhanced MRI with 14N- and 15N-Labled Nitroxyl Radicals"; Proc. Nat'l Acadm'y Sci., vol. 103, No. 5, p. 1463-68 (2006).

T. Czechowski et al., "Two-Dimensional Imaging of Two Types of Radicals by the CW-EPR Method"; Jrnl. of Magnetic Resonance, vol. 190, p. 52-59 (2008).

(Continued)

*Primary Examiner* — Melissa Koval
*Assistant Examiner* — Rishi Patel
(74) *Attorney, Agent, or Firm* — Nath, Goldberg & Meyer; Jerald L. Meyer

(57) ABSTRACT

The invention relates to a method for acquiring, by use of a continuous-wave electron spin resonance imaging scheme that sweeps a magnetic field, a $^{14}$N nitroxy radical distribution image and a $^{15}$N nitroxy radical distribution image in a single image capturing operation. This image acquiring method is characterized in that the central one (B) of three absorption peaks derived from $^{14}$N nitroxy radical is caused to move to a higher or lower magnetic field side and Fourier transform is used to determine a parameter ($\alpha$), which represents the amplitude of the absorption peak of the higher or lower magnetic field side, and a parameter ($\gamma$) which represents the peak position of that absorption peak.

2 Claims, 4 Drawing Sheets

(56) References Cited

OTHER PUBLICATIONS

M. Maltempo et al., "Spectral-Spatial Two-Dimensional EPR Imaging"; Jrnl. of Magnetic Resonance, vol. 72, p. 449-55 (1987).

European Patent Application No. 11812047.6, Extended European Search report dated Dec. 12, 2014, five (5) pages.
Pawlak, A., et al., "Simultaneous CW-EPR Imaging of Isotopic Nitroxyl Radicals", Proc. Soc. Mag. Reson. Med., vol. 19, 2011, p. 1470.

* cited by examiner

IMAGE ACQUIRING METHOD AND IMAGE ACQUIRING APPARATUS

This is a National Phase Application filed under 35 U.S.C. 371 as a national stage of PCT/JP2011/004201, filed Jul. 26, 2011, an application claiming the benefit from the Japanese patent Application No. 2010-167238, filed Jul. 26, 2010.

TECHNICAL FIELD

The present invention relates to an image acquiring method and an image acquiring apparatus for acquiring a free radical distribution image by use of an electron spin resonance imaging method.

BACKGROUND ART

There is a demand for a technique that visualizes a distribution of a specific molecule in an organism from a cell level to an individual level. For example, a lifetime of a free radical in an organism is short, and a spatial distribution thereof is desired to be measured during a short period of time (for example, several seconds). As an apparatus for detecting a free radical, there is an electron spin resonance (ESR) imaging apparatus. The ESR imaging apparatus can selectively detect only a free radical by observing a magnetic moment of an unpaired electron spin of a free radical using resonance absorption of electromagnetic waves.

In a general ESR imaging method, a distribution of a kind of free radical can be visualized, but a distribution of two or more kinds of free radical cannot be visualized in a single measurement. As techniques for visualizing a distribution of two or more kinds of free radical, three techniques below are reported.

As a first technique, an example is reported in which a distribution of $^{14}N$ nitroxy radical and a distribution of $^{15}N$ nitroxy radical are simultaneously visualized using an overhauser effect MRI (see Patent Literature 1 and Non-Patent Literature 1). In the overhauser effect MRI, electron spins in two radicals are separately excited using different magnetic fields by using a fact that an ESR absorption spectrum of $^{15}N$ nitroxy radical is different from an absorption spectrum of $^{14}N$ nitroxy radical when an electron spin is excited. Thus, a distribution of two kinds of free radical is successfully visualized.

As a second technique, an example is reported in which a distribution of two or more kinds of free radical is visualized by estimating a spatial distribution of an electron spin using iterative deconvolution (see Non-Patent Literature 2). In this example, a calculation is performed to reproduce measured projection data using two kinds of spectra. For this reason, time for a calculation of projection data and an image reconstruction is required, and there is a limit to short time processing.

As a third technique, an example is reported in which a distribution of multiple kinds of free radical is visualized by a spectral-spatial ESR imaging method (see Non-Patent Literature 3). The spectral-spatial ESR imaging method can perform a measurement without limiting a kind of free radical. However, to visualize a two-dimensional distribution of a free radical, a three-dimensional spectral-spatial imaging is needed to be performed. To perform the three-dimensional spatial imaging, generally, a spectrum of about the cube of the number of projections (Np) of each direction is needed to be obtained while changing a magnitude and a direction of a magnetic field gradient, and a measurement time increases.

CITATION LIST

Patent Literature

PTL 1
Japanese Patent Application Laid-Open No. 2006-204551

Non-Patent Literature

NPL 1
H. Utsumi et. al, "Simultaneous molecular imaging of redox reactions monitored by Overhauser-enhanced MRI with $^{14}N$- and $^{15}N$-labeled nitroxyl radicals", Proc. Natl. Acad. Sci. U.S.A., Vol. 103, pp. 1463-1468 (2006).

NPL 2
T. Czechowski et. al, "Two-dimensional imaging of two types of radicals by the CW-EPR method", Journal of Magnetic Resonance, Vol. 190, pp. 52-59 (2008).

NPL 3
M. M. Meltempo et al, "Spectral-spatial two-dimensional EPR imaging", Journal of Magnetic Resonance, Vol. 72, pp. 449-455 (1987).

SUMMARY OF INVENTION

Technical Problem

An object of the present invention is to visualize distributions of two kinds of free radicals simultaneously (i.e., by one imaging) by a normal continuous-wave (CW) ESR imaging method.

Solution to Problem

Generally, when ESR spectra of two or more kinds of free radicals are measured, absorption peaks thereof overlap each other on a spectrum, which cannot be separated. Thus, a distribution of each free radical cannot be visualized.

When an ESR spectrum of $^{14}N$ nitroxy radical and $^{15}N$ nitroxy radical which is obtained by replacing nitrogen $^{14}N$ with nitrogen isotope $^{15}N$ is measured, three absorption peaks (an absorption peak A on a lower magnetic field side, a central absorption peak B, and an absorption peak C on a higher magnetic field side) derived from $^{14}N$ nitroxy radical, and two absorption peaks (an absorption peak X on a lower magnetic field side and an absorption peak Y on a higher magnetic field side) derived from $^{15}N$ nitroxy radical are observed. The inventor has noticed that the absorption peak A on the lower magnetic field side overlaps the absorption peak X on the lower magnetic field side, and the absorption peak C on the higher magnetic field side overlaps the absorption peak Y on the higher magnetic field side, but the central absorption peak B can be measured independently of other absorption peaks.

Waveforms of the absorption peak A on the lower magnetic field side, the central absorption peak B, and the absorption peak C on the higher magnetic field side derived from $^{14}N$ nitroxy radical are similar. Therefore, simulating waveforms of the absorption peak A on the lower magnetic field side and the absorption peak C on the higher magnetic field side from the waveform of the central absorption peak B is studied. In the simulation, it is discovered that a position and an amplitude of the absorption peak A on the lower magnetic field side can be determined by moving the central absorption peak B to the lower magnetic field side using Fourier transform. Similarly, in the simulation, it is discovered that a position and an amplitude of the absorption peak C on the higher magnetic field side can be determined by moving the central absorption peak B to the higher magnetic field side using Fourier transform.

That is, by continuously changing an exponent portion of a complex exponential function using a shift in time-domain (magnetic field in this case) of Fourier transform, it is possible to adjust a position of a spectral line shape within an interval between discrete data points.

On the other hand, in a method of moving a data point of discrete data of the central absorption peak B, it is impossible to accurately express discrete data of the absorption peak A on the lower magnetic field side or the absorption peak C on the higher magnetic field side since values at sampling points are not the same. Data points are finite, and about dozens of sampling points of an absorption peak are included at the maximum. Thus, in the present invention, a parameter γ that adjusts a position of a spectral line shape at an accuracy (step size) less than or equal to a discrete data point is searched in order to most excellently approximate line shapes of the absorption peak A on the lower magnetic field side or the absorption peak C on the higher magnetic field side.

In this manner, when the absorption peak A on the lower magnetic field side or the absorption peak C on the higher magnetic field side obtained from the central absorption peak B is subtracted from an ESR spectrum, it is possible to acquire information about the absorption peak X on the lower magnetic field side and the absorption peak Y on the higher magnetic field side derived from $^{15}N$ nitroxy radical. Thus, it is possible to construct a $^{15}N$ nitroxy radical distribution image.

Further, it is possible to construct a $^{14}N$ nitroxy radical distribution image from information about the central absorption peak B without overlapping. Accordingly, it is possible to easily acquire a $^{14}N$ nitroxy radical distribution image and a $^5N$ nitroxy radical distribution image in a single image capturing operation.

The present invention relates to an ESR imaging method for acquiring a free radical distribution image as described below.

An image acquiring method for acquiring, by use of a continuous-wave electron spin resonance (ESR) imaging method including sweeping of a magnetic field, a $^{14}N$ nitroxy radical distribution image and a $^{15}N$ nitroxy radical distribution image in a single image capturing operation, the image acquiring method includes: a process (1): a process for acquiring an ESR spectrum including two absorption peaks, which are an absorption peak A on a lower magnetic field side or an absorption peak C on a higher magnetic field side and a central absorption peak B, derived from $^{14}N$ nitroxy radical, and an absorption peak X on the lower magnetic field side or an absorption peak Y on the higher magnetic field side derived from $^{15}N$ nitroxy radical in a state in which a magnetic field gradient is applied and a state in which a magnetic field gradient is not applied; a process (2): a process for specifying a parameter α that represents an amplitude and a parameter γ that represents a peak position of the absorption peak A on the lower magnetic field side or the absorption peak C on the higher magnetic field side using Fourier transform by moving the central absorption peak B derived from $^{14}N$ nitroxy radical to the lower magnetic field side or the higher magnetic field side in an ESR spectrum acquired in a state in which a magnetic field gradient is not applied in the process (1); a process (3): a process for acquiring information about the absorption peak X on the lower magnetic field side derived from $^{15}N$ nitroxy radical by subtracting the absorption peak A on the lower magnetic field side obtained using the parameter α and the parameter γ specified in the process (2) and the central absorption peak B from a spectral area including the absorption peak A on the lower magnetic field side derived from $^{14}N$ nitroxy radical and the absorption peak X on the lower magnetic field side derived from $^{15}N$ nitroxy radical in the ESR spectrum, or a process for acquiring information about the absorption peak Y on the higher magnetic field side derived from $^{15}N$ nitroxy radical by subtracting the absorption peak C on the higher magnetic field side obtained using the parameter cc and the parameter γ specified in the process (2) and the central absorption peak B from a spectral area including the absorption peak C on the higher magnetic field side derived from $^{14}N$ nitroxy radical and the absorption peak Y on the higher magnetic field side derived from $^{15}N$ nitroxy radical in the ESR spectrum; a process (4): a process for constructing a distribution image of $^{14}N$ nitroxy radical from information about the central absorption peak B in the ESR spectrum; and a process (5): a process for constructing a distribution image of $^{15}N$ nitroxy radical from information about the absorption peak X on the lower magnetic field side or the absorption peak Y on the higher magnetic field side acquired in the process (3).

According to a second aspect of the present invention, the present invention relates to an ESR imaging apparatus for acquiring a free radical distribution image as described below.

An image acquiring apparatus includes: a continuous wave ESR apparatus that acquires an ESR spectrum of a measurement sample; a magnetic field gradient coil that applies a magnetic field gradient to the measurement sample; power-supply devices that drive the magnetic field gradient coils; and a computer that reconstructs an image using the ESR spectrum acquired from the continuous wave ESR apparatus, wherein the ESR apparatus is capable of acquiring an ESR spectrum including two absorption peaks, which are an absorption peak A on a lower magnetic field side or an absorption peak C on a higher magnetic field side and a central absorption peak B, derived from $^{14}N$ nitroxy radical, and an absorption peak X on the lower magnetic field side or an absorption peak Y on the higher magnetic field side derived from $^{15}N$ nitroxy radical in a state in which a magnetic field gradient is applied to the measurement sample by the magnetic field gradient coil, and a state in which a magnetic field gradient is not applied, and the computer executes a process (1): a process for specifying a parameter α that represents an amplitude and a parameter γ that represents a peak position of the absorption peak A on the lower magnetic field side or the absorption peak C on the higher magnetic field side using Fourier transform by moving the central absorption peak B derived from $^{14}N$ nitroxy radical to the lower magnetic field side or the higher magnetic field side in an ESR spectrum acquired in a state in which the magnetic field gradient is not applied, a process (2): a process for acquiring information about the absorption peak X on the lower magnetic field side derived from $^{15}N$ nitroxy radical by subtracting the absorption peak A on the lower magnetic field side obtained using the parameter cc and the parameter γ specified in the process (1) and the central absorption peak B from a spectral area including the absorption peak A on the lower magnetic field side derived from $^{14}N$ nitroxy radical and the absorption peak X on the lower magnetic field side derived from $^{15}N$ nitroxy radical in the ESR spectrum; or a process for acquiring information about the absorption peak Y on the higher magnetic field side derived from $^{15}N$ nitroxy radical by subtracting the absorption peak C on the higher magnetic field side obtained using the parameter α and the parameter γ specified in the process (1) and the central absorption peak B from a spectral area including the absorption peak C on the higher magnetic field side derived from $^{14}N$ nitroxy radical and the absorption peak Y on the higher magnetic field side derived from $^{15}$N nitroxy radical in the ESR spectrum, a process (3): a process for constructing a $^{14}$N nitroxy radical distribution image from information about the central absorption peak B in the ESR spectrum, and a process (4): a process for constructing a $^{15}$N nitroxy radical distribution image from information about the absorption peak X on the lower magnetic field side or the absorption peak Y on the higher magnetic field side acquired in the process (2).

Advantageous Effects of Invention

The image acquiring method of the present invention makes it possible to acquire distribution images of $^{14}$N nitroxy radical and $^{15}$N nitroxy radical which are two kinds of free radicals in a single image capturing operation by use of a continuous-wave electron spin resonance imaging apparatus which is a general ESR apparatus. Furthermore, the number of projections to be acquired equivalent to the number of projections in a conventional general two-dimensional ESR imaging or three-dimensional ESR imaging is sufficient and thus an image scanning in a short period of time is possible.

DESCRIPTION OF EMBODIMENTS

1. Image Acquiring Method of the Present Invention

The image acquiring method of the present invention is a method for acquiring, by use of a continuous-wave electron spin resonance imaging method including sweeping of a magnetic field, a $^{14}$N nitroxy radical distribution image and a $^{15}$N nitroxy radical distribution image in a single image capturing operation.

A range of a magnetic field swept to acquire an ESR spectrum (projection) is set to include two peaks (an absorption peak A on a lower magnetic field side and a central absorption peak B, or an absorption peak C on a higher magnetic field side and the central absorption peak B) of $^{14}$N nitroxy radical to be measured. A specific range is appropriately set according to a kind of $^{14}$N nitroxy radical.

The image acquiring method of the present invention includes Processes (1) to (5).

Process (1) is a process for acquiring an ESR spectrum including two absorption peaks, which are the absorption peak A on the lower magnetic field side and the central absorption peak B, derived from $^{14}$N nitroxy radical and the absorption peak X on the lower magnetic field side derived from $^{15}$N nitroxy radical, or an ESR spectrum including two absorption peaks, which are the central absorption peak B and the absorption peak C on the higher magnetic field side, derived from $^{14}$N nitroxy radical and the absorption peak Y on the higher magnetic field side derived from $^{15}$N nitroxy radical in a state in which a magnetic field gradient is applied and a state in which a magnetic field gradient is not applied.

An acquired ESR spectrum includes at least an ESR spectrum measured in a state in which a magnetic field gradient is not applied, and an ESR spectrum measured in a state in which a magnetic field gradient is applied. An ESR spectrum acquired while systematically changing a direction of a magnetic field gradient is referred also to as projection data.

Figure 1A:
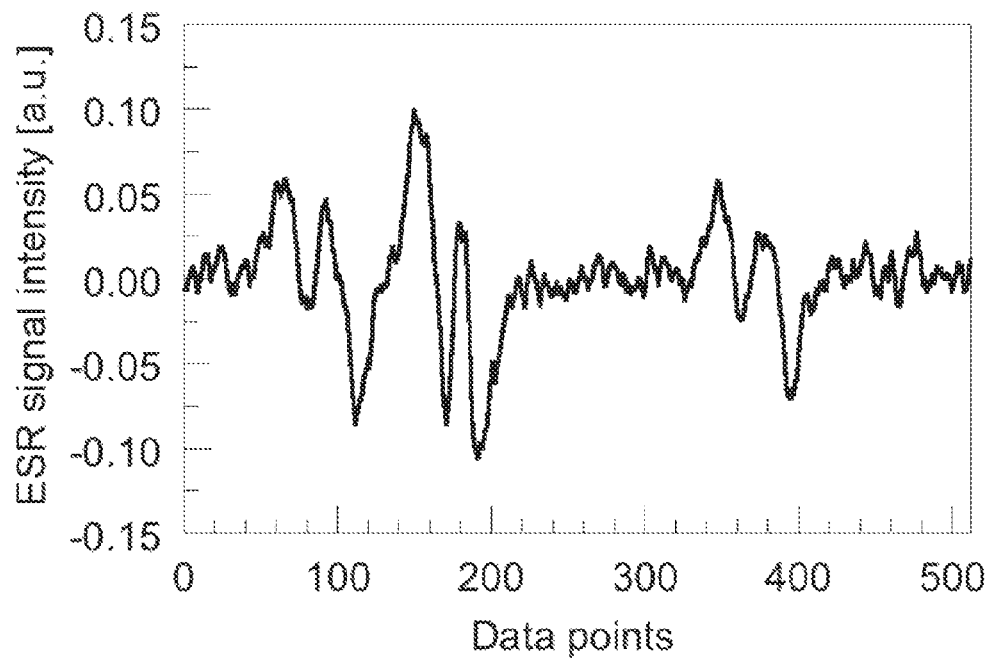
FIG. 1A illustrates an ESR spectrum including an ESR spectrum of $^{14}$N nitroxy radical and an ESR spectrum of $^{15}$N nitroxy radical.

As described above, each of acquired ESR spectra (including projection data) includes the absorption peak A on the lower magnetic field side and the central absorption peak B derived from $^{14}$N nitroxy radical and the absorption peak X on the lower magnetic field side derived from $^{15}$N nitroxy radical, or includes the central absorption peak B and the absorption peak C on the higher magnetic field side derived from $^{14}$N nitroxy radical and the absorption peak Y on the higher magnetic field side derived from $^{15}$N nitroxy radical, respectively. FIG. 1A illustrates an example of a spectrum (projection) in which the absorption peak A and the absorption peak B of a spectrum of $^{14}$N nitroxy radical, and the absorption peak X of a spectrum of $^{15}$N nitroxy radical are included.

Figure 1B:
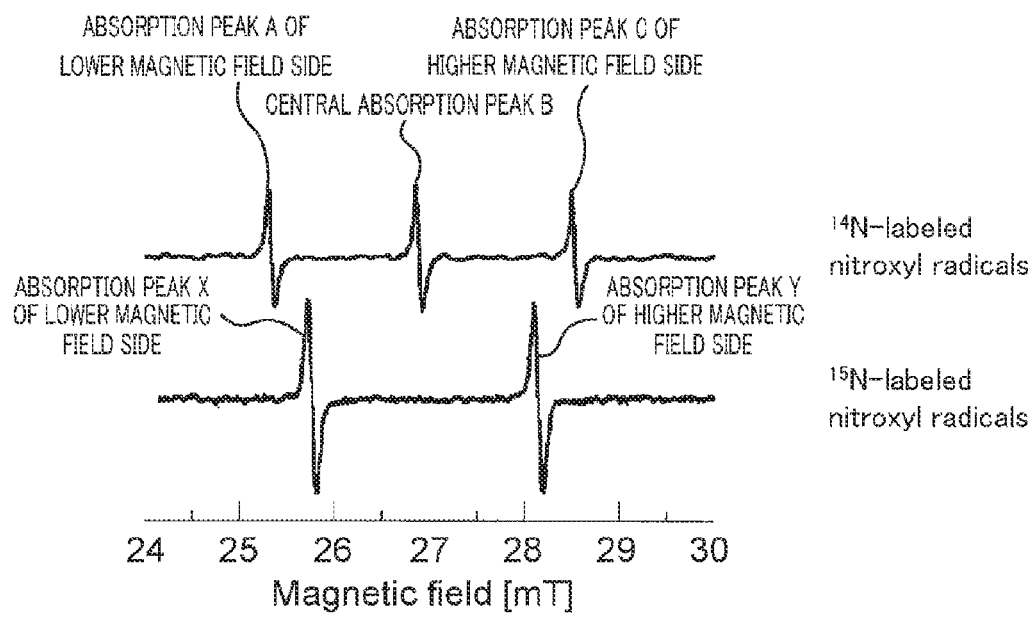
FIG. 1B illustrates ESR spectra of each of $^{14}$N nitroxy radical and $^{15}$N nitroxy radical.

FIG. 1B separately illustrates respective spectra of $^{14}$N nitroxy radical and $^{15}$N nitroxy radical. As seen from FIG. 1B, the central absorption peak B among absorption peaks derived from $^{14}$N nitroxy radical does not overlap and is independent of other absorption peaks. On the other hand, the absorption peak A on the lower magnetic field side and the absorption peak X on the lower magnetic field side are close to each other and overlap each other, and the absorption peak C on the higher magnetic field side and the absorption peak Y on the higher magnetic field side are close to each other and overlap each other. In particular, in an ESR spectrum (projection data) measured in a state in which a magnetic field gradient is applied, a spectral line shape changes by reflecting a spatial distribution of an electron spin and thus, an overlapping degree increases. Accordingly, it is impossible to separately acquire respective distribution images of $^{14}$N nitroxy radical and $^{15}$N nitroxy radical.

Therefore, an operation for separating spectra of $^{14}$N nitroxy radical and $^{15}$N nitroxy radical is performed. The separation operation is performed after dividing a measured spectrum (projection) into a spectral area on the higher magnetic field side and a spectral area on the lower magnetic field side. That is, when "the absorption peak A on the lower magnetic field side, the central absorption peak B, and the absorption peak X on the lower magnetic field side" are included in a spectrum (projection), the separation operation is performed after a division into a spectral area including the central absorption peak B, and a spectral area including absorption peak A of the lower magnetic field side and the absorption peak X on the lower magnetic field side. On the other hand, when "the absorption peak C on the higher magnetic field side, the central absorption peak B, and the absorption peak Y on the higher magnetic field side" are included in a spectrum (projection), the separation operation is performed after a division into a spectral area including the central absorption peak B, and a spectral area including the absorption peak C on the higher magnetic field side and the absorption peak Y on the higher magnetic field side.

Process (2) is a process for determining a parameter cc that represents an amplitude and a parameter γ that represents a peak position of the absorption peak A on the lower magnetic field side or the absorption peak C on the higher magnetic field side using Fourier transform by moving the central absorption peak B derived from $^{14}$N nitroxy radical to a higher magnetic field side or a lower magnetic field side in an ESR spectrum acquired in a state in which a magnetic field gradient is not applied in Process (1).

Specifically, first, a waveform f of the central absorption peak B is moved to the higher magnetic field side or the lower magnetic field side in an ESR spectrum measured in a state in which a magnetic field gradient is not applied. When moved to a lower magnetic field side, a position and an intensity (amplitude) most closely matching the absorption peak A on the lower magnetic field side are determined. Similarly, when moved to a higher magnetic field side, a position and an intensity (amplitude) most closely matching the absorption peak C on the higher magnetic field side are determined.

At this time, a parameter α that represents an amplitude and a parameter γ that represents a position of a spectrum are obtained. A waveform $f_{shifted}$ obtained by moving the waveform f of the central absorption peak B is expressed as a function of a magnetic flux density B by the following Equation.

$$f_{shifted}(B) = IFT\left\{\alpha \sum_{n=0}^{m} c_n \exp(-i\omega_n \gamma)\right\}$$ [Equation 1]

In the above Equation, IFT denotes inverse Fourier transform, $c_n$ denotes an n-th complex Fourier coefficient of the waveform f, i denotes a complex unit, and $\omega_n$ denotes an n-th spatial angular frequency.

Process (3) is a process for acquiring information about the absorption peak X on the lower magnetic field side derived from $^{15}$N nitroxy radical by subtracting the absorption peak A on the lower magnetic field side obtained using the parameter α and the parameter γ determined in Process (2) and the central absorption peak B under a magnetic field gradient from a spectral area including the absorption peak A on the lower magnetic field side derived from $^{14}$N nitroxy radical and the absorption peak X on the lower magnetic field side derived from $^{15}$N nitroxy radical in the ESR spectrum, or is a process for acquiring information about the absorption peak Y on the higher magnetic field side derived from $^{15}$N nitroxy radical by subtracting the absorption peak C on the higher magnetic field side obtained using the parameter α and the parameter γ determined in Process (2) and the central absorption peak B under a magnetic field gradient from a spectral area including the absorption peak C on the higher magnetic field side derived from $^{14}$N nitroxy radical and the absorption peak Y on the higher magnetic field side derived from $^{15}$N nitroxy radical in the ESR spectrum.

Specifically, for each of ESR spectra (spectrum measured in a state in which a magnetic field gradient is applied, and spectrum measured in a state in which a magnetic field gradient is not applied) acquired in Process (1), data (spectral line shape) obtained by moving the waveform f of the central absorption peak B to a lower magnetic field side is acquired, or data (spectral line shape) obtained by moving the waveform f of the central absorption peak B to a higher magnetic field side is acquired using the parameter α that represents the amplitude and the parameter γ that represents the position of the spectrum obtained in Process (2).

When acquired data is data obtained by moving the waveform f of the central absorption peak B to a lower magnetic field side, information about the absorption peak X on the lower magnetic field side is acquired by subtracting the data from a spectral area including the absorption peak A on the lower magnetic field side and the absorption peak X on the lower magnetic field side of an ESR spectrum. On the other hand, when acquired data is data obtained by moving the waveform f of the central absorption peak B to a higher magnetic field side, information about the absorption peak Y on the higher magnetic field side is acquired by subtracting the data from a spectral area including the absorption peak C on the higher magnetic field side and the absorption peak Y on the higher magnetic field side of an ESR spectrum.

Process (4) is a process for constructing a distribution image of $^{14}$N nitroxy radical from information about the central absorption peak B in the ESR spectrum.

Process (5) is a process for constructing a distribution image of $^{15}$N nitroxy radical from information about the absorption peak X on the lower magnetic field side or the absorption peak Y on the higher magnetic field side acquired in Process (3). Since the absorption peak X on the lower magnetic field side and the absorption peak Y on the higher magnetic field side have the same waveform, an image can be reconstructed from either one of the absorption peaks X and Y.

In this way, it is possible to acquire both a $^{14}$N nitroxy radical distribution image and a $^{15}$N nitroxy radical distribution image in a single image capturing operation.

Figure 2:
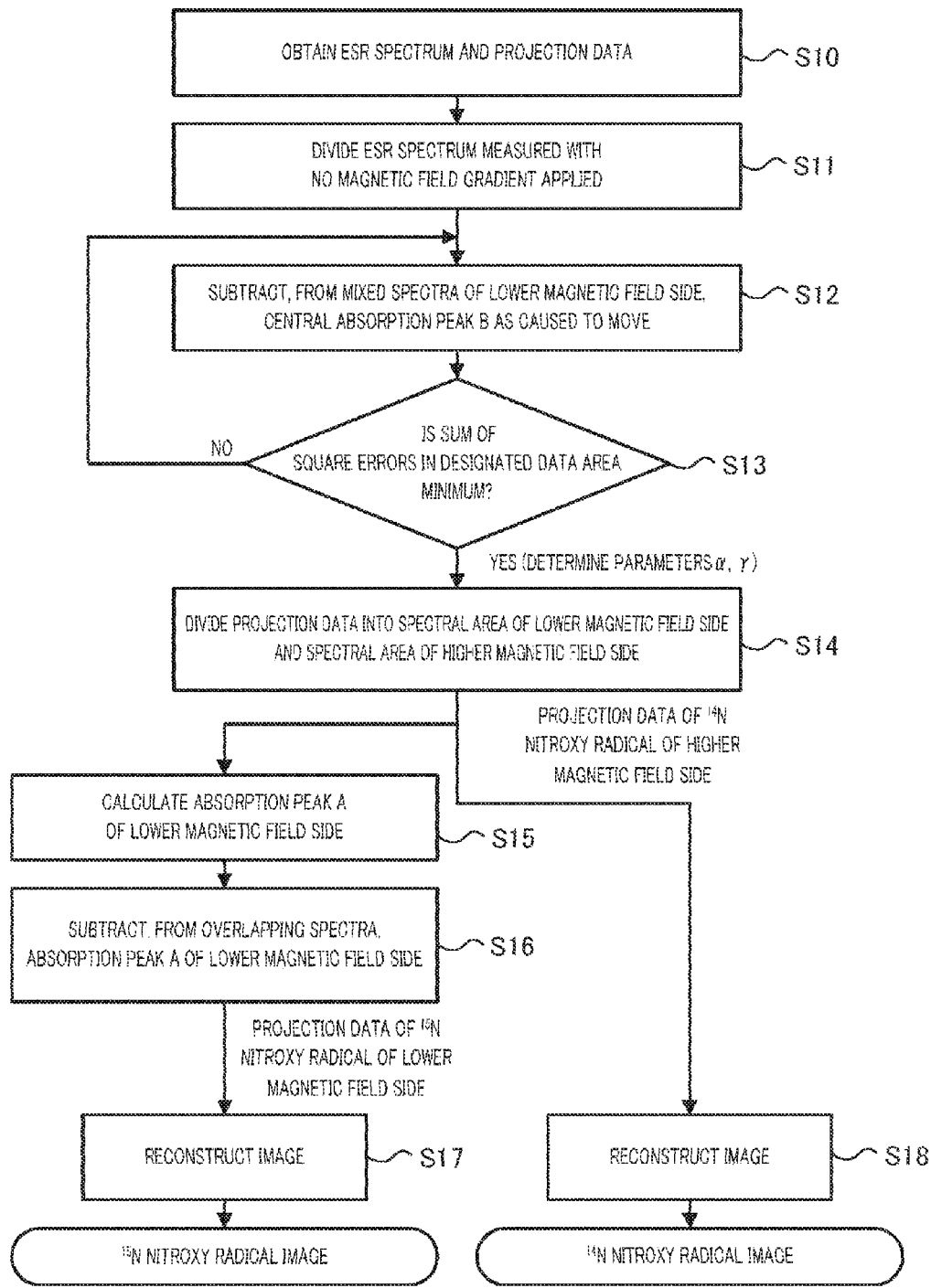
FIG. 2 is a flowchart of an image acquiring method of the present invention.

The above measurement flow is summarized in FIG. 2. In the flow illustrated in FIG. 2, the central absorption peak B derived from $^{14}$N nitroxy radical is moved to a lower magnetic field side. However, the same result is obtained when moved to a higher magnetic field side.

First, in S10, an ESR spectrum measured in a state in which a magnetic field gradient is not applied and projection data are acquired. The projection data includes an ESR spectrum measured in a state in which a magnetic field gradient is applied. Herein, an area including the absorption peak A on the lower magnetic field side and the central absorption peak B derived from $^{14}$N nitroxy radical, and the absorption peak X on the lower magnetic field side derived from $^{15}$N nitroxy radical is measured. Thus, the absorption peak C on the higher magnetic field side derived from $^{14}$N nitroxy radical, and the absorption peak Y on the higher magnetic field side derived from $^{15}$N nitroxy radical are not measured.

In S11, the ESR spectrum measured in a state in which a magnetic field gradient is not applied is divided into a spectral area on the higher magnetic field side and a spectral area on the lower magnetic field side. The central absorption peak B derived from $^{14}$N nitroxy radical is included in the divided spectral area on the higher magnetic field side. On the other hand, the absorption peak A on the lower magnetic field side derived from $^{14}$N nitroxy radical and the absorption peak X on the lower magnetic field side derived from $^{15}$N nitroxy radical are included in the spectral area on the lower magnetic field side.

In S12, the central absorption peak B derived from $^{14}$N nitroxy radical is moved to a lower magnetic field side. The moved peak is subtracted from a mixed spectrum of the absorption peak A on the lower magnetic field side derived from $^{14}$N nitroxy radical and the absorption peak X on the lower magnetic field side derived from $^{15}$N nitroxy radical. As a result of subtraction, the central absorption peak B is moved so that a sum of square errors in a designated data area is minimum (S13). When the sum of square errors in a designated data area is minimum, the parameter α that represents an amplitude and the parameter γ that represents a position of a spectrum are obtained. Herein, a sum $E_{RMS}$ of square errors is expressed by Equation below. Herein, $f_{low}$ represents a data area (data point m) designated in an ESR spectrum on the lower magnetic field side divided in S14.

$$E_{RMS} = \sum_{n=1}^{m} \{f_{low}(n) - f_{shifted}(n)\}^2 \quad \text{[Equation 2]}$$

In S14, projection data (each ESR spectrum) measured in S10 is divided into a spectral area on the lower magnetic field side and a spectral area on the higher magnetic field side. A spectrum on the lower magnetic field side is used in S15 through S17. On the other hand, a spectrum on the higher magnetic field side is used in S18.

In S15, the absorption peak A on the lower magnetic field side derived from $^{14}$N nitroxy radical is calculated based on the parameter α representing an amplitude, the parameter γ representing a position of a spectrum, and the central absorption peak B. In S16, projection data of $^{15}$N nitroxy radical on the lower magnetic field side is obtained by subtracting the calculated absorption peak A on the lower magnetic field side from a spectrum overlapping in the lower magnetic field side. A $^{15}$N nitroxy radical distribution image is acquired by reconstructing an image using information about the absorption peak X on the lower magnetic field side included in the obtained projection data (S17).

In S18, an image is reconstructed using information about the central absorption peak B derived from $^{14}$N nitroxy radical, and a $^{14}$N nitroxy radical distribution image is acquired.

2. Image Acquiring Apparatus of the Present Invention

Figure 3:
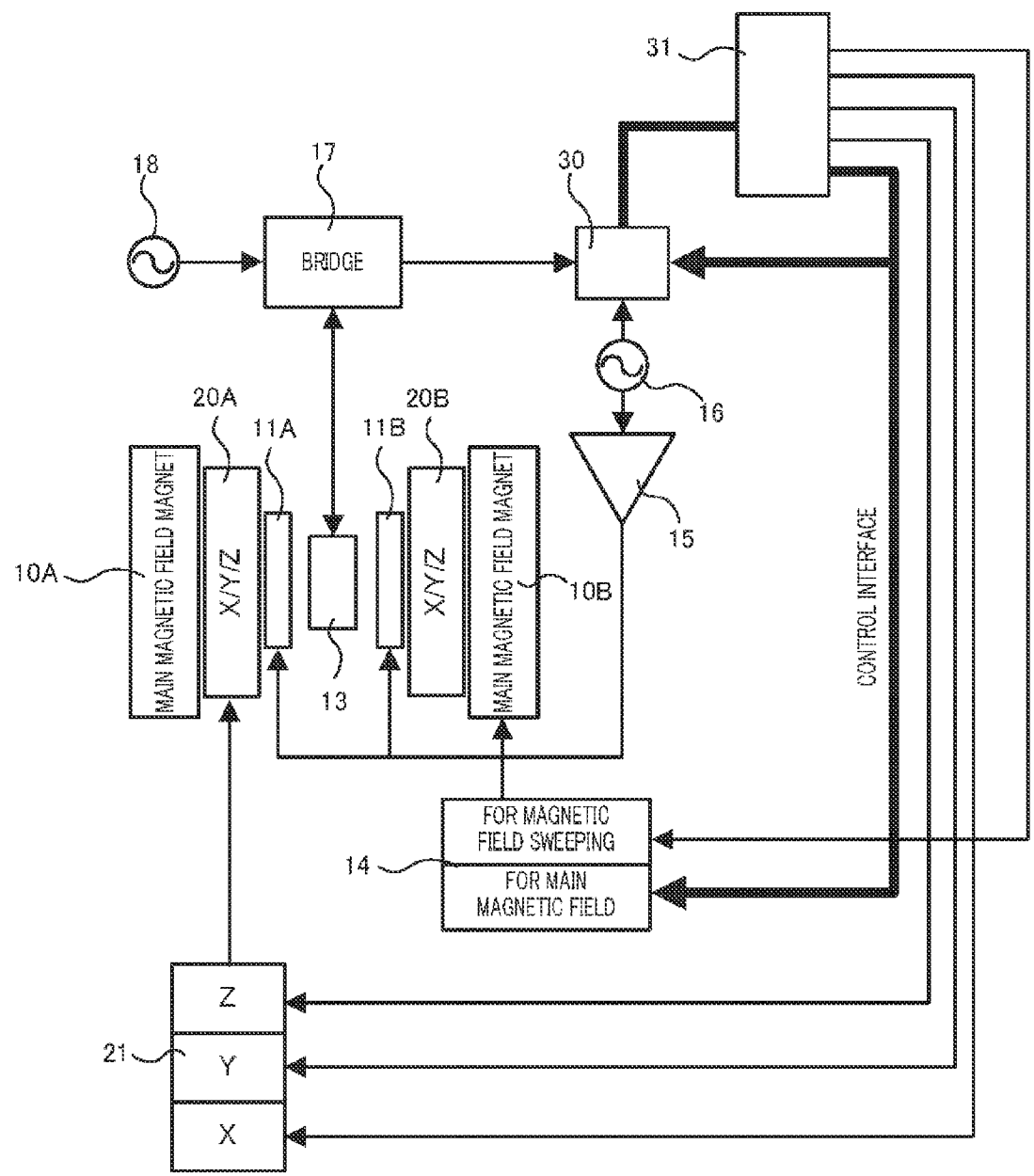
FIG. 3 is a conceptual diagram of an image acquiring apparatus of the present invention.

The image acquiring apparatus of the present invention includes components below.
1) Continuous wave ESR apparatus
2) Magnetic field gradient coil that applies a magnetic field gradient to a measurement sample, and power-supply device that drives the magnetic field gradient coil
3) Computer that reconstructs an image by acquiring spectral data FIG. 3 is a conceptual diagram of an image acquiring apparatus of the present invention.

A continuous wave ESR apparatus includes, as main components, a pair of main magnetic field magnets 10A and 10B, a pair of magnetic field modulation coils 11A and 11B, and resonator probe 13. The continuous wave ESR apparatus includes power source 14 for magnetic field sweeping and main magnetic field, amplifier 15 and modulation oscillator 16 connected to magnetic field modulation coils 11A and 11B, bridge 17 connected to resonator probe 13, radiofrequency oscillator 18 connected to bridge 17, and the like.

A pair of magnetic field gradient coils 20A and 20B that apply a magnetic field gradient to a measurement sample is disposed between main magnetic field magnet 10A and magnetic field modulation coil 11A, and between main magnetic field magnet 10B and magnetic field modulation coil 11B, respectively. The image acquiring apparatus of the present invention further includes power-supply device 21 that drives magnetic field gradient coil 20A.

A computer that acquires spectral data and reconstructs an image includes phase-sensitive detection circuit 30 and data acquisition control computer 31 connected to phase-sensitive detection circuit 30. Data acquisition control computer 31 controls power source 14 and power-supply device 21.

The continuous wave ESR apparatus acquires an ESR spectrum including three absorption peaks, which are the absorption peak A on the lower magnetic field side, the central absorption peak B, and the absorption peak C on the higher magnetic field side, derived from $^{14}$N nitroxy radical, and the absorption peak X on the lower magnetic field side and the absorption peak Y on the higher magnetic field side derived from $^{15}$N nitroxy radical in a state in which a magnetic field gradient is applied to a measurement sample and a state in which a magnetic field gradient is not applied to a measurement sample. The continuous wave ESR apparatus may be a known measurement instrument as an instrument itself. Phase-sensitive detection circuit 30 of FIG. 3 outputs an ESR spectrum acquired in the continuous wave ESR apparatus.

The computer that acquires spectral data and reconstructs an image stores a program for processing an ESR spectrum acquired in the continuous wave ESR apparatus according to Processes (2) through (4) described above in data acquisition control computer 31. The program causes the computer to execute Processes (1) through (4) below.

Process (1): a process for specifying a parameter α that represents an amplitude and a parameter γ that represents a peak position of the absorption peak A on the lower magnetic field side or the absorption peak C on the higher magnetic field side using Fourier transform by moving the central absorption peak B derived from $^{14}$N nitroxy radical to a lower magnetic field side or a higher magnetic field side in an ESR spectrum acquired in a state in which the magnetic field gradient is not applied. Process (2): a process for acquiring information about the absorption peak X on the lower magnetic field side derived from $^{15}$N nitroxy radical by subtracting the absorption peak A on the lower magnetic field side obtained using the parameter α and the parameter γ specified in Process (1) and the central absorption peak B from a spectral area including the absorption peak A on the lower magnetic field side derived from $^{14}$N nitroxy radical and the absorption peak X on the lower magnetic field side derived from $^{15}$N nitroxy radical in the ESR spectrum; or a process for acquiring information about the absorption peak Y on the higher magnetic field side derived from $^{15}$N nitroxy radical by subtracting the absorption peak C on the higher magnetic field side obtained using the parameter α and the parameter γ specified in Process (1) and the central absorption peak B from a spectral area including the absorption peak C on the higher magnetic field side derived from $^{14}$N nitroxy radical and the absorption peak Y on the higher magnetic field side derived from $^{15}$N nitroxy radical in the ESR spectrum. Process (3): a process for constructing a $^{14}$N nitroxy radical distribution image from information about the central absorption peak B in the ESR spectrum. Process (4): a process for constructing a $^{15}$N nitroxy radical distribution image from information about the absorption peak X on the lower magnetic field side or the absorption peak Y on the higher magnetic field side acquired in Process (2).

EXAMPLES

Aqueous solution of $^{14}$N nitroxy radical and/or $^{15}$N nitroxy radical is prepared. A specific structure of a nitroxy radical is as follows.

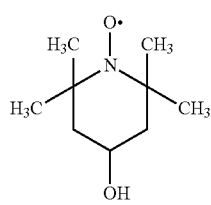

[Formula 1]

Figure 4A:
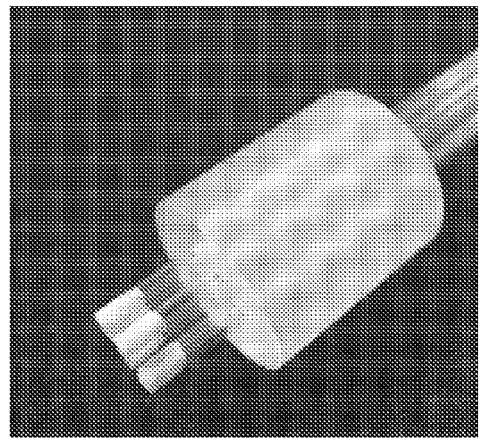
FIG. 4A is a diagram illustrating a measurement cell used in Embodiment.
Figure 4B:
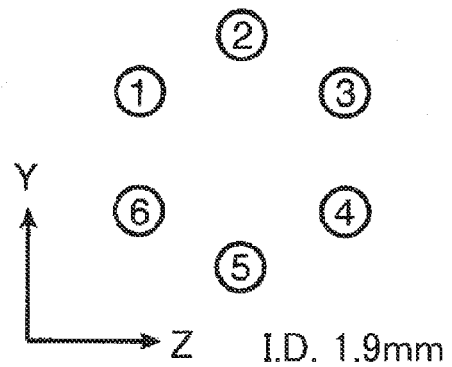
FIG. 4B is a schematic diagram illustrating a layout arrangement of a glass tube in the measurement cell.

A measurement cell illustrated in FIG. 4A is prepared. Six glass tubes (first to sixth glass tubes) are set in the measurement cell illustrated in FIG. 4A. As illustrated in FIG. 4B, each glass tube is disposed to be positioned at a vertex of a regular hexagon. An amount of aqueous solution in each glass tube is 0.1 ml. A concentration of a nitroxy radical in aqueous solution in each glass tube is as follows.

[First Glass Tube]
$^{14}$N nitroxy radical 1.0 mM, $^{15}$N nitroxy radical 0.0 mM
[Second Glass Tube]
$^{14}$N nitroxy radical 0.8 mM, $^{15}$N nitroxy radical 0.2 mM
[Third Glass Tube]
$^{14}$N nitroxy radical 0.6 mM, $^{15}$N nitroxy radical 0.4 mM
[Fourth Glass Tube]
$^{14}$N nitroxy radical 0.4 mM, $^{15}$N nitroxy radical 0.6 mM
[Fifth Glass Tube]
$^{14}$N nitroxy radical 0.2 mM, $^{15}$N nitroxy radical 0.8 mM
[Sixth Glass Tube]
$^{14}$N nitroxy radical 0.0 mM, $^{15}$N nitroxy radical 1.0 mM For aqueous solution in each glass tube of the measurement cell, distribution images of $^{14}$N nitroxy radical and $^{15}$N nitroxy radical are concurrently acquired by the method of the present invention using the continuous wave ESR apparatus. A specific spectrum measurement condition is described below. Under the condition below, the absorption peak A on the lower magnetic field side and the central absorption peak B derived from $^{14}$N nitroxy radical, and the absorption peak X on the lower magnetic field side derived from $^{15}$N nitroxy radical are measured.

Figure 4C:
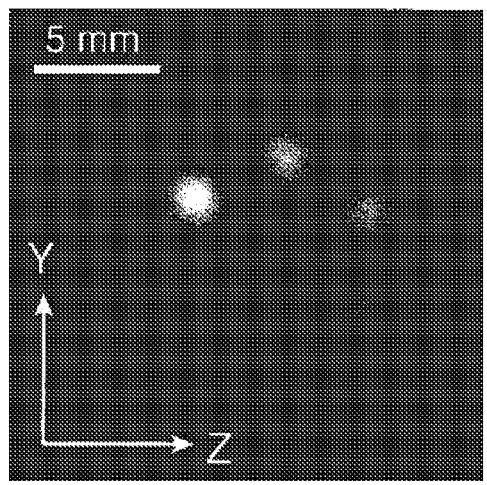
FIG. 4C illustrates a $^{14}$N nitroxy radical distribution image.
Figure 4D:
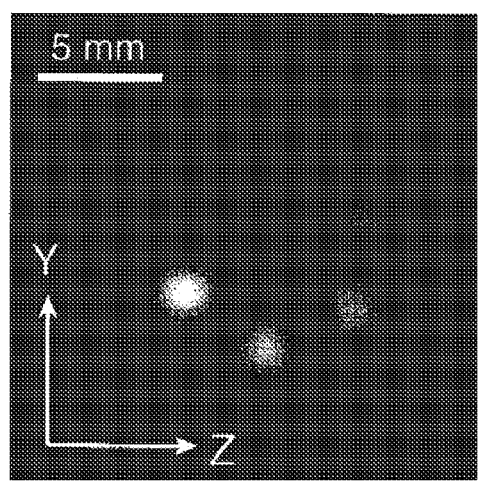
FIG. 4D illustrates a $^{15}$N nitroxy radical distribution image.

Magnetic field sweeping width: 3 mT
Magnetic field sweeping time: 2 seconds
Magnetic field modulation amplitude: 0.03 mT
Magnetic field gradient: 40 mT/m
Time constant of a phase detection circuit: 3 ms
Number of projections: 64
Cumulated number: 8
Microwave power: 2.5 mW FIG. 4C illustrates a $^{14}$N nitroxy radical distribution image, and FIG. 4D illustrates a $^{15}$N nitroxy radical distribution image. As illustrated in FIGS. 4C and 4D, a $^{14}$N nitroxy radical distribution and a $^{15}$N nitroxy radical distribution can be separately subjected to imaging (visualizing) in a single measurement.

When a free radical distribution is visualized by an ESR imaging method, a resolution $\delta$ is obtained by dividing a line width $\Delta B$ of an ESR spectrum by a magnetic field gradient G ($\delta = \Delta B/G$). For example, when a line width $\Delta B$ of an ESR spectrum is 0.1 mT and a magnetic field gradient G is 50 mT/m, a resolution $\delta$ is 2 mm (=0.1 (mT)/50 (mT/m)). However, in a process of an image regeneration, a resolution can be improved by approximately twice due to an effect of deconvolution. Thus, conclusively, it is possible to achieve a resolution of $\delta' = \Delta B/(2G)$. In the above example, a resolution of 1 mm is achieved. Therefore, a resolution is mainly limited by a line shape of a measured ESR spectrum of a free radical. When a magnetic field gradient is increased to improve a resolution, an excited electron spin decreases. As a result, a signal strength of a spectrum decreases, and visualization is difficult to be performed. Therefore, even though a detection sensitivity is an element of determining a resolution conclusively, a resolution is determined by a line width and an applied magnetic field gradient under a condition in which a signal can be sufficiently detected.

In an ESR imaging apparatus used in Example, when 4-hydroxyl-2,2,6,6-tetramethylpiperidine-1-oxyl (TEMPOL) aqueous solution of 0.1 mM is measured in a magnetic field sweeping for 0.1 second, a signal-to-noise ratio of an ESR spectrum is 40. When a measurement time (cumulative time) is long, the signal-to-noise ratio is improved according to a square root thereof.

This application claims priority to Japanese Patent Application No. 2010-167238 filed on Jul. 26, 2010. The entire contents disclosed in the specification and the drawings thereof are incorporated herein.

INDUSTRIAL APPLICABILITY

According to the present invention, it is possible to visualize a distribution of two kinds of free radical simultaneously (in a single image capturing operation) for a short period of time by a normal continuous-wave (CW) ESR imaging method. For example, the image acquiring method and the image acquiring apparatus of the present invention are useful for measurement of a distribution of a free radical in an organism.

REFERENCE SIGNS LIST 10A, 10B Main magnetic field magnet
11A, 11B Magnetic field modulation coil
13 Resonator probe
14 Power source for magnetic field sweeping and main magnetic field
15 Amplifier
16 Modulation oscillator
17 Bridge
18 Radiofrequency oscillator
20A, 20B Magnetic field gradient coil
21 Power-supply device
30 Phase-sensitive detection circuit
31 Data acquisition control computer

The invention claimed is:

1. An image acquiring method for acquiring, by use of a continuous-wave electron spin resonance (ESR) imaging method including sweeping of a magnetic field, a $^{14}$N nitroxy radical distribution image and a $^{15}$N nitroxy radical distribution image in a single image capturing operation, the image acquiring method comprising:

a process (1): a process for acquiring ESR spectra including two absorption peaks, which are an absorption peak A on a lower magnetic field side or an absorption peak C on a higher magnetic field side and a central absorption peak B, derived from $^{14}$N nitroxy radical, and an absorption peak X on the lower magnetic field side or an absorption peak Y on the higher magnetic field side derived from $^{15}$N nitroxy radical in a state in which a magnetic field gradient is applied and a state in which a magnetic field gradient is not applied, wherein the ESR spectra includes a first ESR spectrum acquired in a state in which a magnetic field gradient is applied and a second ESR spectrum acquired in a state in which a magnetic field gradient is not applied;

a process (2): a process for specifying a parameter $\alpha$ that represents an amplitude and a parameter $\gamma$ that represents a peak position of the absorption peak A on the lower magnetic field side or the absorption peak C on the higher magnetic field side using Fourier transform by moving the central absorption peak B derived from $^{14}$N nitroxy radical to the lower magnetic field side or the higher magnetic field side in the second ESR spectrum acquired in the process (1);

a process (3): a process for acquiring information about the absorption peak X on the lower magnetic field side derived from $^{15}$N nitroxy radical by subtracting the absorption peak A on the lower magnetic field side obtained using the parameter α and the parameter γ specified in the process (2) and the central absorption peak B from a spectral area including the absorption peak A on the lower magnetic field side derived from $^{14}$N nitroxy radical and the absorption peak X on the lower magnetic field side derived from $^{15}$N nitroxy radical in the ESR spectra, or a process for acquiring information about the absorption peak Y on the higher magnetic field side derived from $^{15}$N nitroxy radical by subtracting the absorption peak C on the higher magnetic field side obtained using the parameter α and the parameter γ specified in the process (2) and the central absorption peak B from a spectral area including the absorption peak C on the higher magnetic field side derived from $^{14}$N nitroxy radical and the absorption peak Y on the higher magnetic field side derived from $^{15}$N nitroxy radical in the ESR spectra;

a process (4): a process for constructing a distribution image of $^{14}$N nitroxy radical from information about the central absorption peak B in the ESR spectra; and a process (5): a process for constructing a distribution image of $^{15}$N nitroxy radical from information about the absorption peak X on the lower magnetic field side or the absorption peak Y on the higher magnetic field side acquired in the process (3).

2. An image acquiring apparatus comprising:

a continuous wave ESR apparatus that acquires ESR spectra of a measurement sample;

a magnetic field gradient coil that applies a magnetic field gradient to the measurement sample;

a power-supply device that drives the magnetic field gradient coil; and a computer that reconstructs an image using the ESR spectra acquired from the continuous wave ESR apparatus, wherein the ESR apparatus is capable of acquiring the ESR spectra including two absorption peaks, which are an absorption peak A on a lower magnetic field side or an absorption peak C on a higher magnetic field side and a central absorption peak B, derived from $^{14}$N nitroxy radical, and an absorption peak X on the lower magnetic field side or an absorption peak Y on the higher magnetic field side derived from $^{15}$N nitroxy radical in a state in which a magnetic field gradient is applied to the measurement sample by the magnetic field gradient coil and a state in which a magnetic field gradient is not applied, wherein the ESR apparatus includes a first ESR spectrum acquired in a state in which a magnetic field gradient is applied and a second ESR spectrum acquired in a state in which a magnetic field gradient is not applied, and the computer executes a process (1): a process for specifying a parameter α that represents an amplitude and a parameter γ that represents a peak position of the absorption peak A on the lower magnetic field side or the absorption peak C on the higher magnetic field side using Fourier transform by moving the central absorption peak B derived from $^{14}$N nitroxy radical to the lower magnetic field side or the higher magnetic field side in the second ESR spectrum, a process (2): a process for acquiring information about the absorption peak X on the lower magnetic field side derived from $^{15}$N nitroxy radical by subtracting the absorption peak A on the lower magnetic field side obtained using the parameter α and the parameter γ specified in the process (1) and the central absorption peak B from a spectral area including the absorption peak A on the lower magnetic field side derived from $^{14}$N nitroxy radical and the absorption peak X on the lower magnetic field side derived from $^{15}$N nitroxy radical in the ESR spectra; or a process for acquiring information about the absorption peak Y on the higher magnetic field side derived from $^{15}$N nitroxy radical by subtracting the absorption peak C on the higher magnetic field side obtained using the parameter α and the parameter γ specified in the process (1) and the central absorption peak B from a spectral area including the absorption peak C on the higher magnetic field side derived from $^{14}$N nitroxy radical and the absorption peak Y on the higher magnetic field side derived from $^{15}$N nitroxy radical in the ESR spectra, a process (3): a process for constructing a $^{14}$N nitroxy radical distribution image from information about the central absorption peak B in the ESR spectra, and a process (4): a process for constructing a $^{15}$N nitroxy radical distribution image from information about the absorption peak X on the lower magnetic field side or the absorption peak Y on the higher magnetic field side acquired in the process (2).

* * * * *